United States Patent
Kaminski et al.

(10) Patent No.: US 6,626,300 B2
(45) Date of Patent: Sep. 30, 2003

(54) RACK ASSEMBLY THAT DOES NOT REQUIRE TOOLS FOR COUPLING CHASSIS TO SLIDE

(75) Inventors: Joseph W. Kaminski, Campbell, CA (US); Robert M. Hintz, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 5 days.

(21) Appl. No.: 10/015,074

(22) Filed: Dec. 10, 2001

(65) Prior Publication Data

US 2003/0106865 A1 Jun. 12, 2003

(51) Int. Cl.[7] .................................................. A47F 5/00
(52) U.S. Cl. ................... 211/26; 312/223.2; 312/334.8; 361/683
(58) Field of Search .................. 211/26, 192; 403/315, 403/329, 397; 312/223.2, 334.8; 361/683; 248/221.11, 221.12, 222.11, 222.41

(56) References Cited

U.S. PATENT DOCUMENTS

| | | | | |
|---|---|---|---|---|
| 3,125,316 A | * | 3/1964 | Wilmhoff | |
| 3,491,820 A | * | 1/1970 | Ostling | |
| 4,331,369 A | * | 5/1982 | Lazar et al. | |
| 4,470,716 A | * | 9/1984 | Welch | |
| 4,838,627 A | * | 6/1989 | Macias | |
| 5,738,462 A | * | 4/1998 | Petersen et al. | |
| 6,209,979 B1 | * | 4/2001 | Fall et al. | 312/334.8 X |
| 6,373,707 B1 | * | 4/2002 | Hutchins | |
| 6,416,145 B1 | * | 7/2002 | Singh | |

* cited by examiner

*Primary Examiner*—Robert W. Gibson, Jr.

(57) ABSTRACT

A method and apparatus for easily and inexpensively coupling a chassis to a slide. Computer related components are disposed within a chassis that is disposed within a rack. A sliding assembly that includes an inner slide allows the chassis to be extended from the rack such that the computer related component can be easily replaced or serviced. The inner slide has an opening extending therethrough that is partially covered by a spring that extends over the opening. A protrusion extends from a side surface of the chassis that can be engaged with the opening so as to couple the chassis to the inner slide. When the protrusion is being inserted into the opening, the spring deforms so as to allow the protrusion to enter the uncovered portion of the opening. When the protrusion reaches the uncovered portion of the opening the spring automatically moves back into its undeformed shape so as to engage the protrusion. The protrusion is secured between the end of the spring and the sides of the opening where the opening is uncovered, securely latching the chassis to the slide. The chassis can be easily uncoupled from the slide by deforming the spring and removing the protrusion from the opening.

19 Claims, 11 Drawing Sheets

RACK ASSEMBLY THAT DOES NOT REQUIRE TOOLS FOR COUPLING CHASSIS TO SLIDE

TECHNICAL FIELD

The present invention relates to the field of rack mounts. More specifically, the present invention relates to coupling a chassis to a slide of a rack assembly.

BACKGROUND ART

Racks are often used for storing computer components. A rack is a frame or cabinet into which the computer components are mounted. Many types of electronics and computing devices come in rack mounted packages, including servers, test instruments, telecommunications components and tape drives.

In a typical rack assembly, each computer component is attached to a chassis. The chassis is then be bolted into the rack or placed on a shelf located within the rack. In many instances sliding assemblies are used that allow the chassis to be extended from the rack. This allows for easy access to computer components.

Conventional sliding assemblies typically include two or more slides that are permanently attached such that the slides can move relative to each other within a specific range of motion. Typically, the slides are attached to the rack and are attached to the chassis using nuts and screws.

The use of nuts and screws for attaching slides is time consuming. Also, nuts and bolts can be dropped, resulting in lost parts and possibly causing malfunctions if the parts are lost within a computer-related component.

It is sometimes necessary to detach the chassis from the slide that is attached to the chassis. The process of detaching the slide from the chassis is difficult and time consuming because each nut and bolt must be removed. In addition, nuts and bolts can be dropped during the detachment process, resulting in lost parts and possibly causing malfunctions if the parts are lost within a computer-related component.

Also, the use of nuts and bolts requires that the person doing the installation have the required tools. Often the person doing the installation does not have the required tools, further increasing installation and removal time and expense.

Accordingly, a method and apparatus is needed that allows for easily and inexpensively coupling a chassis to a slide. Moreover, a method and apparatus is needed that does not require the use of tools to couple the chassis to the slide. Furthermore, a method and apparatus is needed that meets the above needs and that allows for uncoupling the chassis from the slide without the use of tools.

DISCLOSURE OF THE INVENTION

The method and apparatus of the present invention allows for easily and inexpensively coupling a chassis to a slide. Moreover, the method and apparatus of the present invention does not require the use of tools to couple the chassis to the slide. In addition, tools are not required for uncoupling the chassis from the slide.

A rack assembly is disclosed that includes a rack. Computer related components are disposed within one or more chassis that is disposed within the rack. A plurality of longitudinal members referred to as slides allow the chassis to be extended from the rack such that the computer related component can be easily replaced or serviced.

In one embodiment of the present invention a protrusion extends from a side surface of the chassis. In the present embodiment the protrusion is an L-shaped member that extends from the side surface of the chassis.

One of the longitudinal members referred to herein as an inner slide has an opening extending therethrough. A flat spring is coupled to the inner slide such that the spring partially extends over the opening. The size of the opening is sufficient to allow the protrusion to be inserted into the opening.

The chassis is easily coupled to the slide by engaging the protrusion with the opening so as to latch the protrusion between sides of the opening that are not covered by the spring and the end of the end of the spring.

More particularly, coupling of the chassis to the slide is accomplished by inserting the protrusion into the opening. When the protrusion is being inserted into the opening the spring deforms so as to allow the protrusion to enter the uncovered portion of the opening. When the protrusion reaches the uncovered portion of the opening the spring automatically moves back into its undeformed shape so as to engage the protrusion. The protrusion is thereby automatically secured between the end of the spring and the sides of the opening where the opening is uncovered, securely latching the chassis to the slide. This operation does not require any tools. Thus, the chassis is easily coupled to the slide without the use of any tools.

The chassis can be easily uncoupled from the slide by deforming the spring and removing the protrusion from the opening. More particularly, the spring is deformed such that the spring no longer engages the protrusion. The protrusion is then moved out of the opening while the spring is deformed. This operation does not require any tools. Thus, the chassis is easily uncoupled from the slide without the use of any tools.

In one embodiment, the protrusion has a cross section across that portion of the protrusion that extends through the opening that has a shape that corresponds to the shape of the uncovered portion of the opening. In the present embodiment, the respective shapes of the cross section and the uncovered portion of the opening are identical such that the protrusion is securely held between the sides of the opening and the end of the spring. However, the respective shapes of the cross section and the uncovered portion of the opening can be different so long as the protrusion is securely held between the sides of the opening and the end of the spring.

Thus, the method and apparatus of the present invention allows for easily and inexpensively coupling a chassis to a slide. Also, the method and apparatus of the present invention does not require the use of tools to couple the chassis to the slide. In addition, tools are not required for uncoupling the chassis from the slide.

Other features and advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should not be understood as being drawn to scale except if specifically noted.

BEST MODES FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1A:
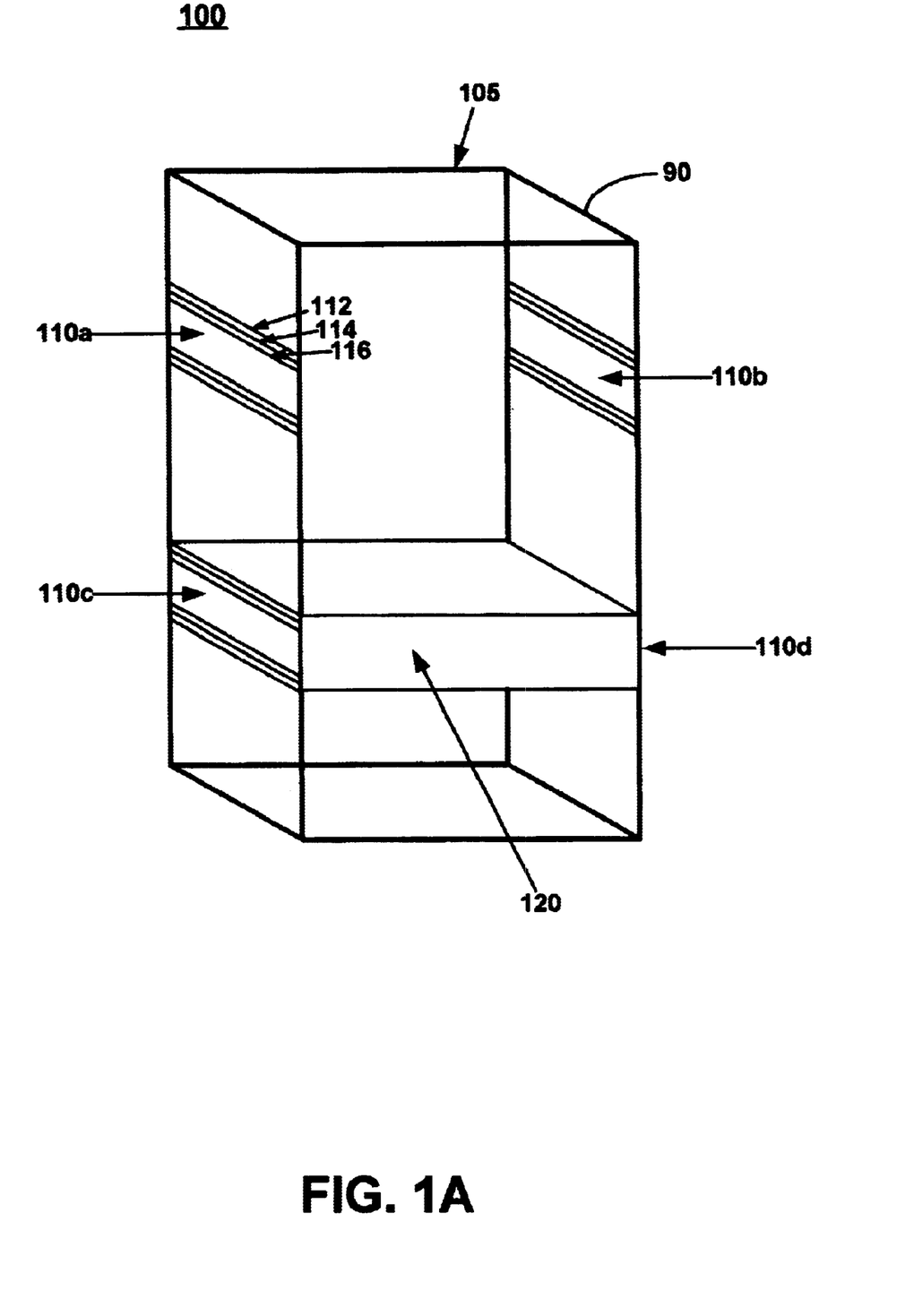
FIG. 1A is a perspective view of a rack assembly that includes two pairs of slide assemblies in an unextended position in accordance with one embodiment of the present invention.

FIG. 1A shows rack assembly 100 that includes slide assemblies 110a–110d that are in an unextended position. Rack assembly 100 also includes chassis 120 and rack 90. Slide assemblies 110c and 110d are coupled to rack 90 and are coupled to chassis 120. Chassis 120 is shown in FIG. 1A to be in an unextended position due to the positioning of slide assemblies 110c and 110d. Chassis 120 is for receiving computer-related components such as, for example, a test instrument, telecommunications equipment, a data storage device, a server, a printer, a display, etc.

Figure 1B:
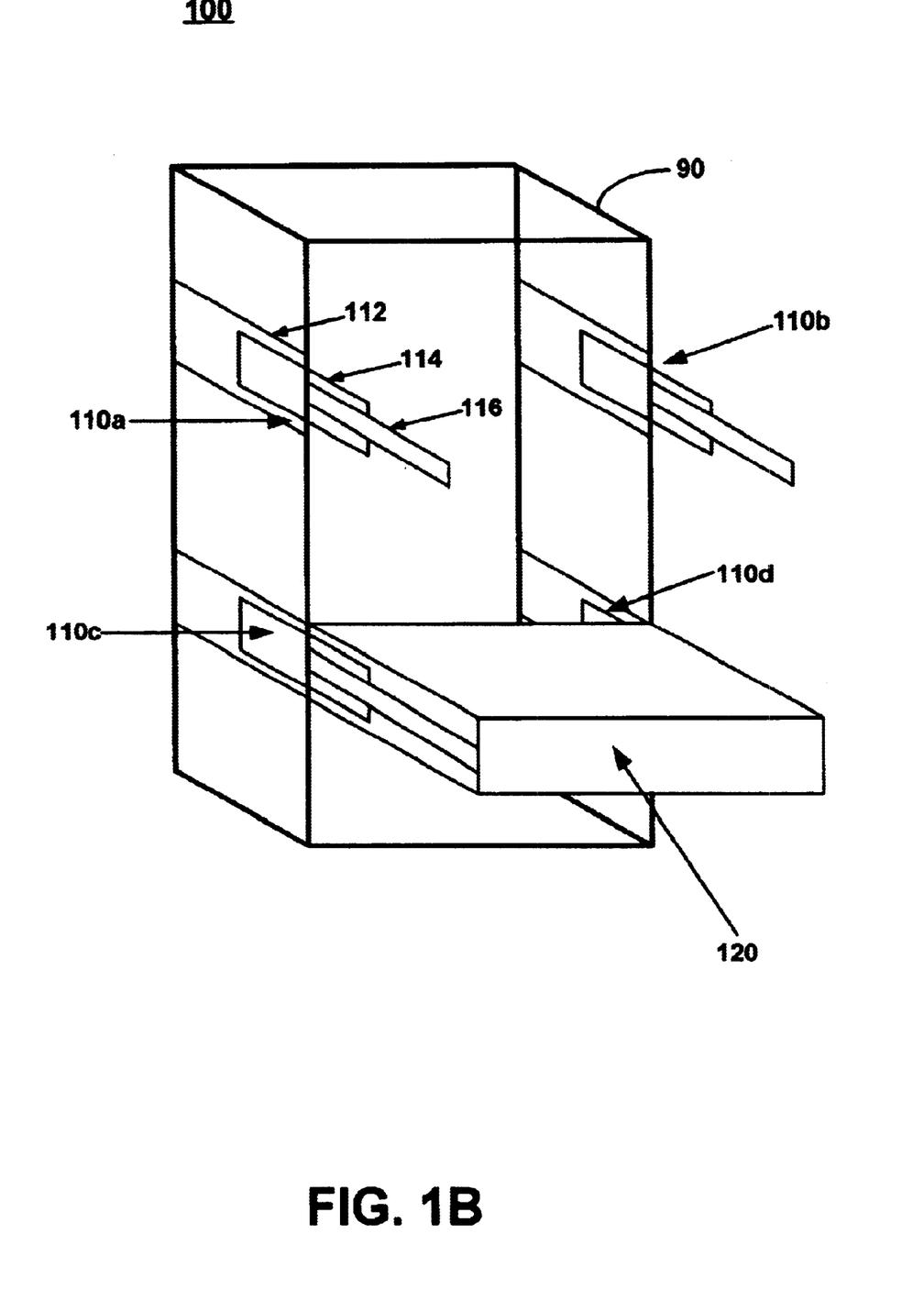
FIG. 1B is a perspective view of a rack assembly that includes two pairs of slide assemblies in a fully extended position in accordance with one embodiment of the present invention.

Slide assemblies 110a–110d are operable such that they can be extended out from the unextended position illustrated in FIG. 1A to a fully extended position illustrated in FIG. 1B. More particularly, the extension of slide assemblies 110c and 110d is operable to move chassis 120 into the fully extended position illustrated in FIG. 1B. In the fully extended position the computer-related components within chassis 120 can be readily accessed for service and/or replacement.

Continuing with FIGS. 1A–1B, slide assemblies 110a–d include outer slide 112, intermediate slide 114, and inner slide 116. In one embodiment, outer slide 112 is slidably engaged with intermediate slide 114 such that intermediate slide 114 can slide lengthwise with respect to outer slide 112. Similarly, inner slide 116 slidably engages with intermediate slide 114 such that inner slide 116 can slide lengthwise with respect to intermediate slide 114.

Figure 2:
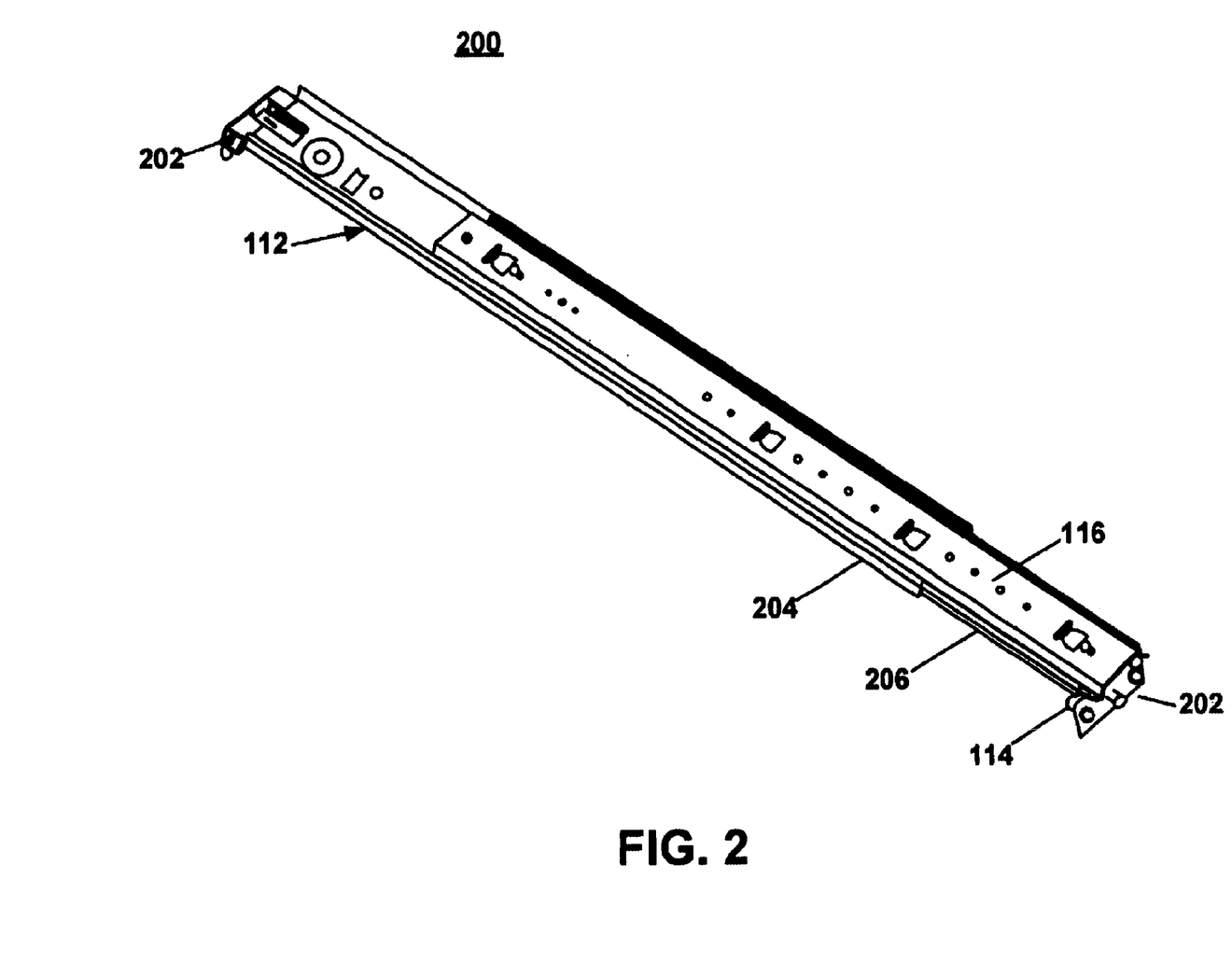
FIG. 2 shows a perspective view of a slide assembly in accordance with one embodiment of the present invention.

FIG. 2 shows slide assembly 200 in accordance with one embodiment of the present invention. Slide assembly 200 includes mounting flange 202, outer slide 112, intermediate slide 114 and inner slide 116. In the present embodiment mounting flange 202 is used for mounting slide assembly 200 to a rack (e.g., rack 90 of FIGS. 1A–1B).

Continuing with FIG. 2, outer slide 112 includes first outer slide component 204 and second outer slide component 206. First outer slide component 204 and second outer slide component 206 allow for adjusting the length of slide assembly 200. More particularly, rack assemblies vary in depth. First outer slide component 204 and second outer slide component 206 operating in conjunction provide for adjustment relating to depth. Therefore, slide assembly 200 can be used in a wide range of rack depths.

In the present embodiment, outer slide 112 is coupled to rack 90 of FIGS. 1A–1B and is slidably engaged with intermediate slide 114 such that intermediate slide 114 can slide lengthwise with respect to outer slide 112. Similarly, inner slide 116 slidably engages with intermediate slide 114 such that inner slide 116 can slide lengthwise with respect to intermediate slide 114.

Figure 3A:
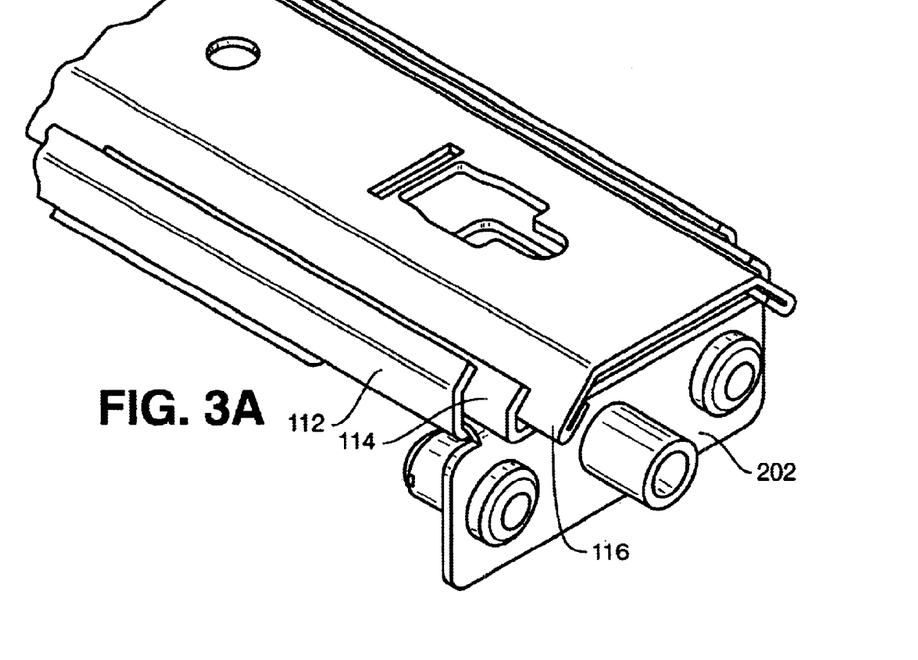
FIG. 3A illustrates an expanded view of a portion of slide assembly 200 of FIG. 2 in which the intermediate slide and the inner slide are slid outward with respect to the outer slide.
Figure 3B:
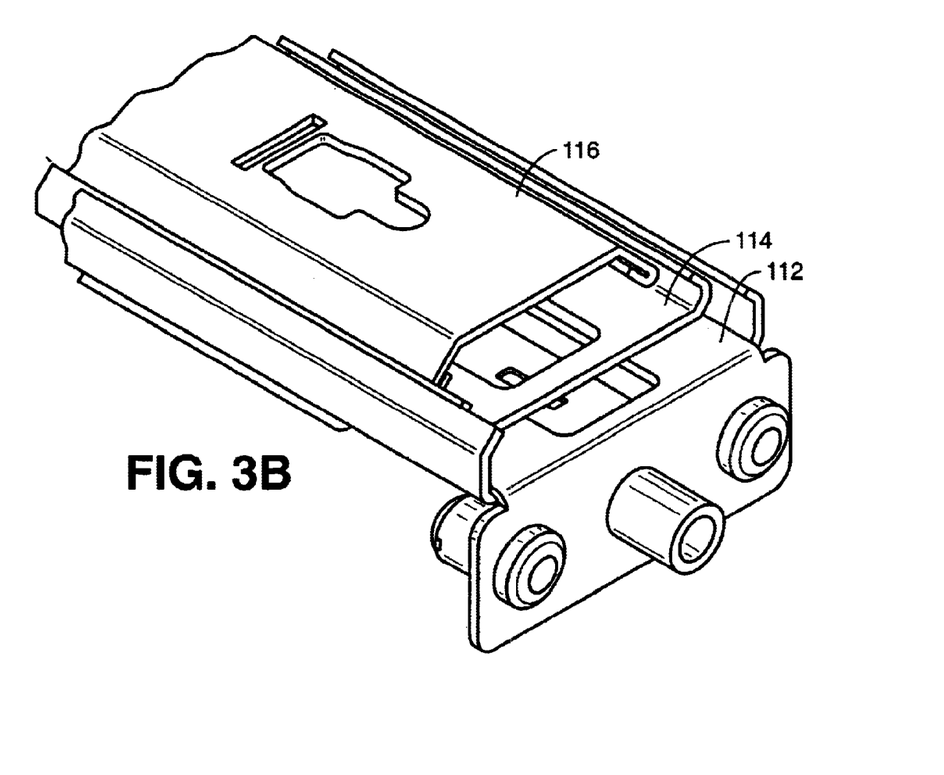
FIG. 3B illustrates an expanded view of a portion of slide assembly 200 of FIG. 2 in which the intermediate slide and the inner slide are slid inward with respect to the outer slide in accordance with one embodiment of the present invention.

FIGS. 3A and 3B show expanded perspective views of a portion of the slide assembly of FIG. 2 in accordance with one embodiment of the present invention. In the embodiment of FIG. 3A intermediate slide 114 and inner slide 116 are shown to be slid outward from outer slide 112. In the embodiment shown in FIG. 3B intermediate slide 114 and inner slide 116 are shown to be slid inward with respect to outer slide 112.

Continuing with FIGS. 3A–3B outer slide 112 includes edges that are angled and intermediate slide 114 includes corresponding edges that are angled. The shape of the edges of outer slide 112 and intermediate slide 114 allow intermediate slide 114 to be engaged with outer slide 112 such that intermediate slide 114 can slide lengthwise with respect to outer slide 112 and such that the two slides are held together laterally. In the present embodiment, once outer slide 112 is engaged with intermediate slide 114 the two slides can only move within a limited range lengthwise with respect to each other.

Still referring to FIGS. 3A–3B inner slide 116 also includes edges that are angled and that correspond to edges of intermediate slide 114. The shape of the angled edges of inner slide 112 and intermediate slide 114 allow intermediate slide 114 to be engaged with inner slide 116 such that intermediate slide 114 and inner slide 116 are held together laterally. In the present embodiment, once inner slide 116 is engaged with intermediate slide 114 the two slides can only move lengthwise within a limited range with respect to each other.

Figure 4:
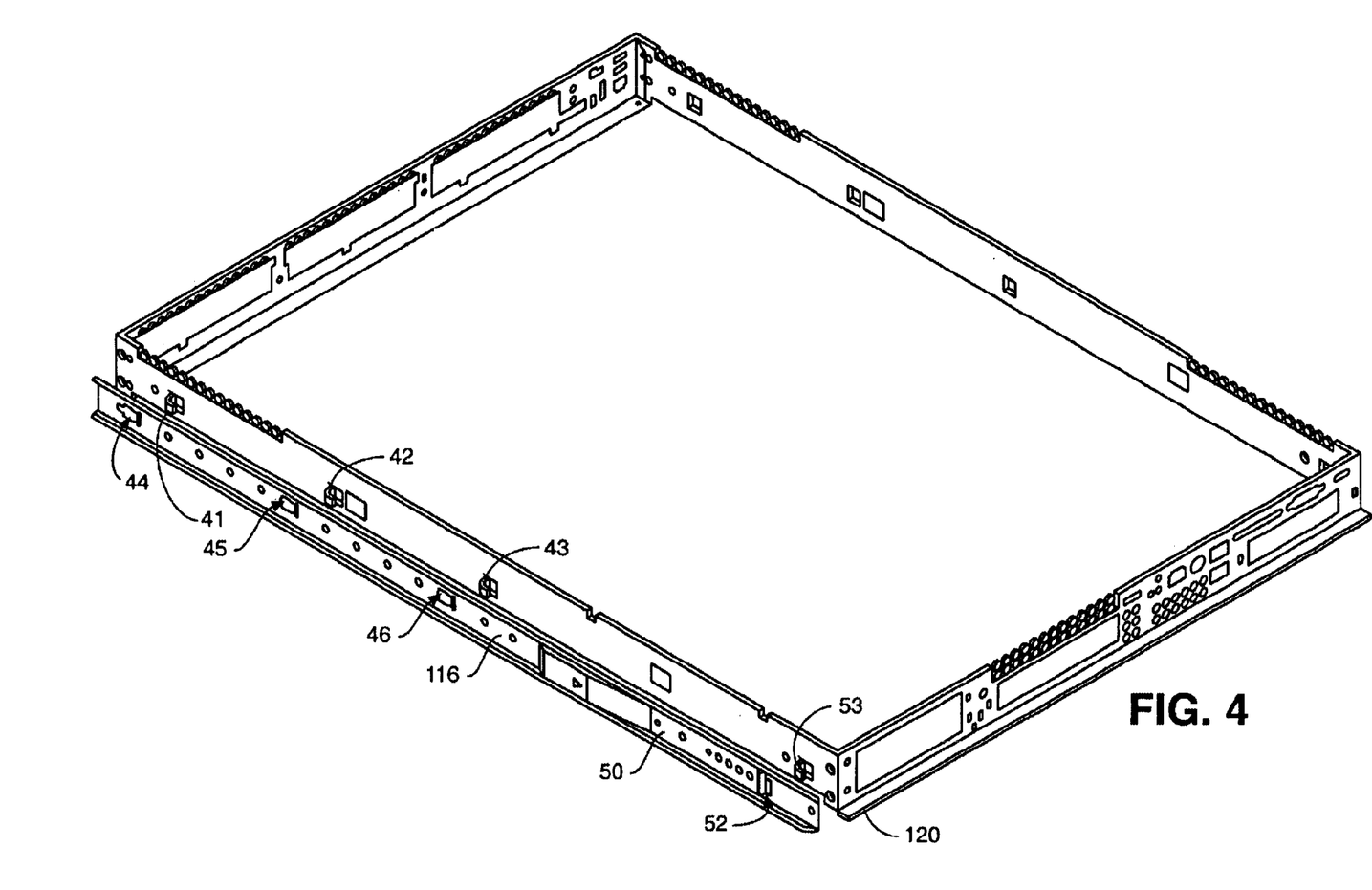
FIG. 4 shows an inner slide that is disposed near a side surface of a chassis in accordance with one embodiment of the present invention.

Referring now to FIG. 4, chassis 120 is shown to include protrusions 41–43 and 53 that are L-shaped and that extend from chassis 120. Openings 44–46 and 52 are disposed within inner slide 116. In the present embodiment openings 44–46 and 52 correspond to protrusions 41–43 and 53 such that protrusions 41–43 and 53 can be inserted into openings 44–46 and 52. More particularly, when inner slide 116 is engaged with chassis 120 protrusion 41 engages opening 44, protrusion 42 engages opening 45, protrusion 43 engages opening 46 and protrusion 53 engages opening 52 for coupling chassis 120 to inner slide 116.

In the present embodiment protrusion 53 includes a first portion that extends substantially perpendicular to the side surface of chassis 120 and includes a second portion that extends substantially parallel to the side surface of chassis 120. The second portion acts to keep chassis 120 and inner slide 116 coupled, preventing chassis 120 from separating laterally from inner slide 116.

Figure 5A:
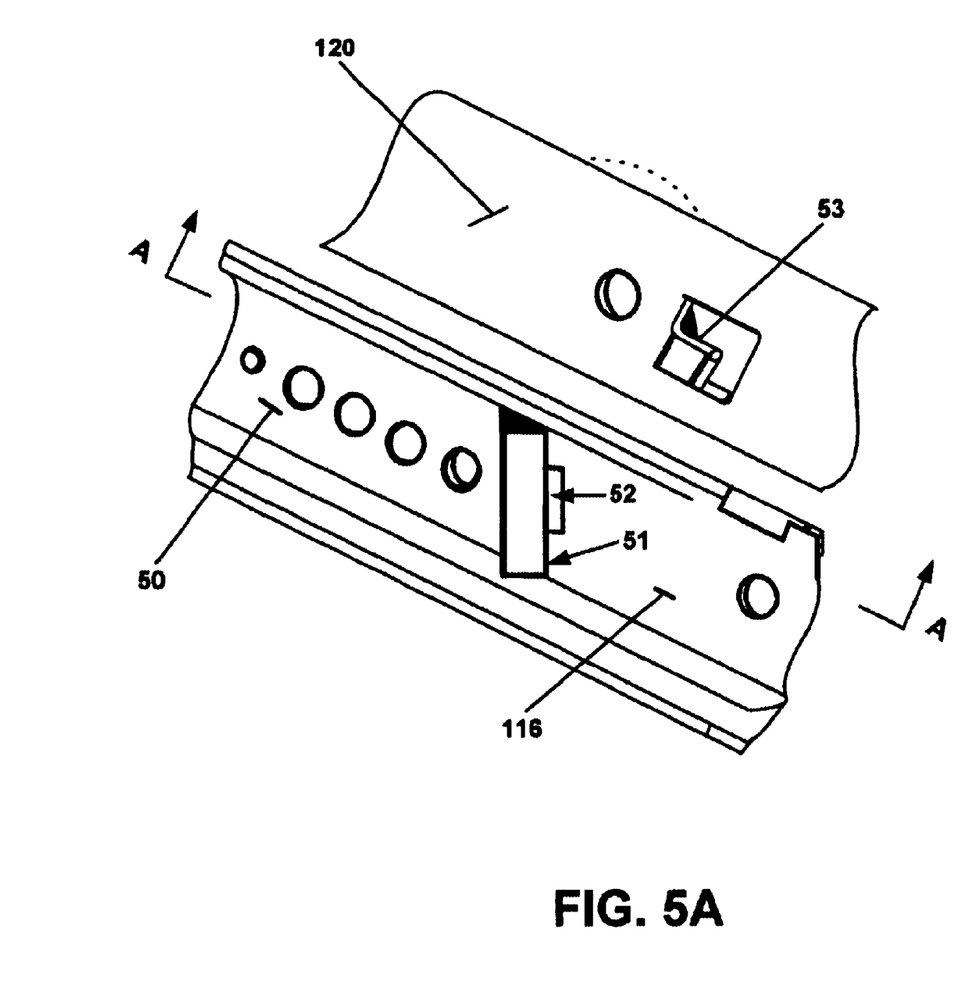
FIG. 5A shows an expanded cut-away view of a portion of the inner slide and a portion of the chassis of FIG. 4 in accordance with one embodiment of the present invention.

FIG. 5A shows a cut away view of a portion of the structure of FIG. 4 that contains protrusion 53 and opening 52. It can be seen that spring 50 extends over opening 52 so as to partially cover opening 52. In the present embodiment that portion of opening 52 that is not covered by spring 50 is rectangular in shape. However, alternatively other shapes could also be formed such as, for example a rounded shape, an oval shape, etc. More particularly, in one embodiment of the present invention protrusion 53 has a cross sectional shape that is rounded across that portion of protrusion 53 that extends through opening 52 and opening 52 has a corresponding rounded shape. In another embodiment of the present invention protrusion 53 has a cross sectional shape that is oval across that portion of protrusion 53 that extends through opening 52 and opening 52 has a corresponding oval shape.

Figure 5B:
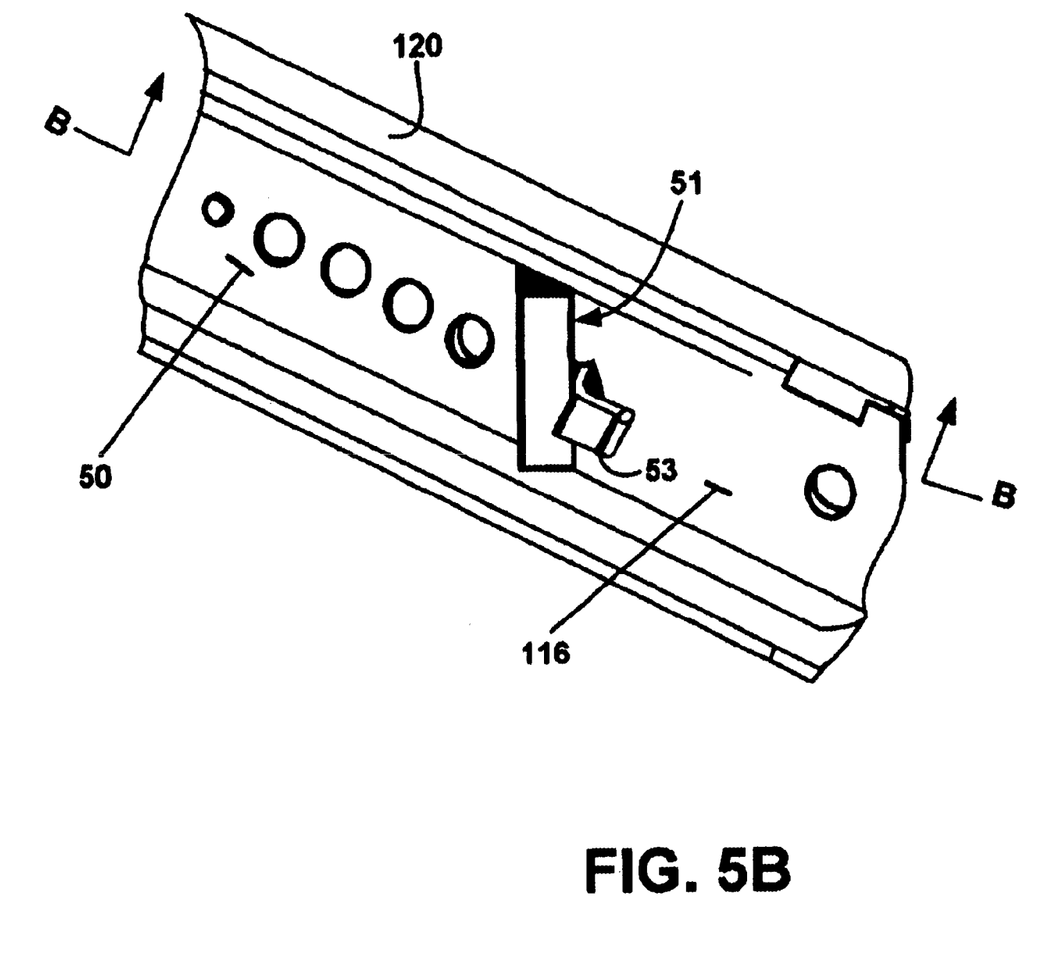
FIG. 5B shows an expanded cut-away view of a portion of the inner slide and a portion of the chassis of FIG. 4 after the protrusion has been inserted into the opening in the inner slide so as to latch the inner slide to the chassis in accordance with an embodiment of the present invention.
Figure 6A:
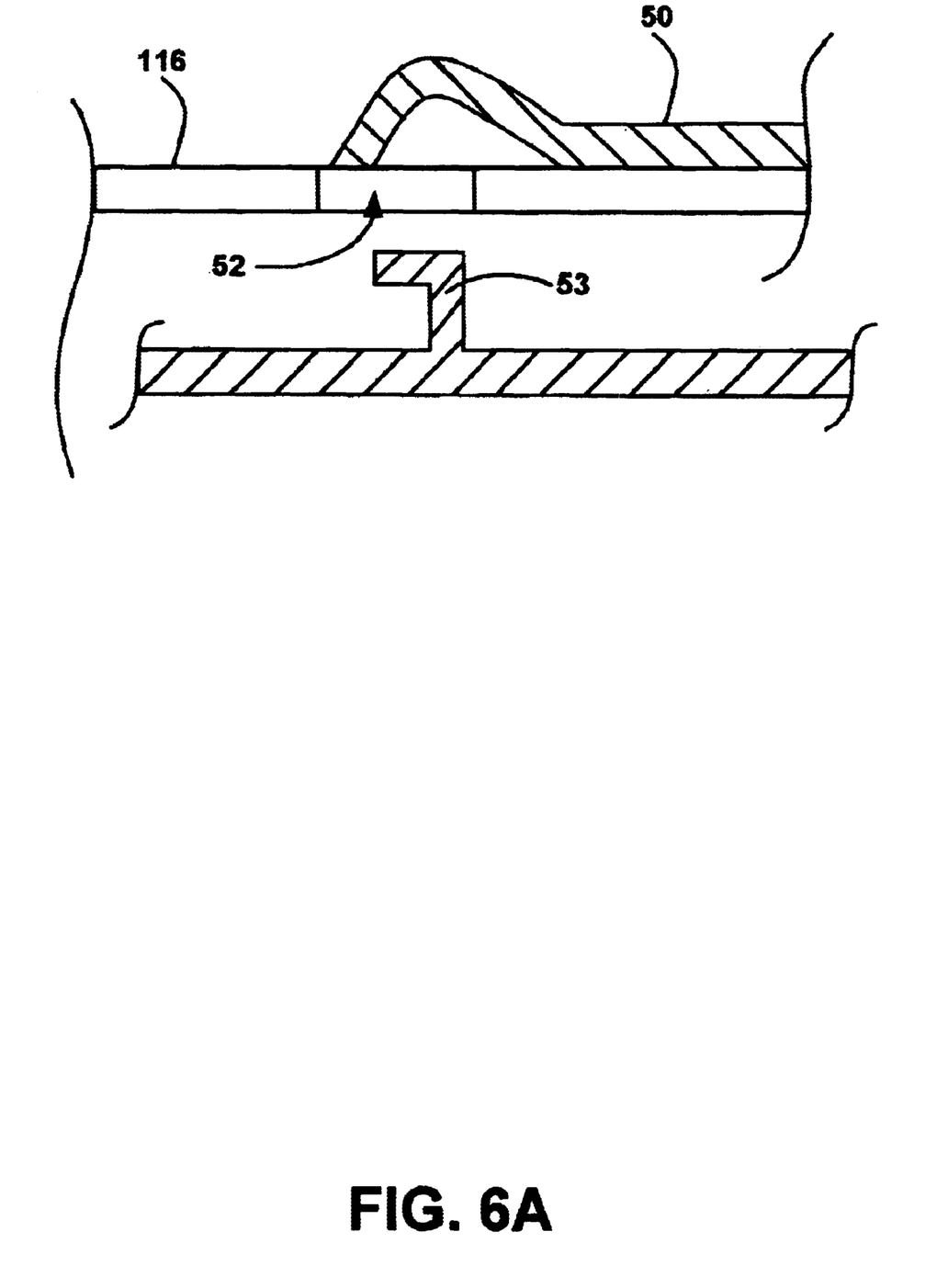
FIG. 6A shows an expanded cross sectional view of the structure of FIG. 5A across section A—A in accordance with an embodiment of the present invention.
Figure 6B:
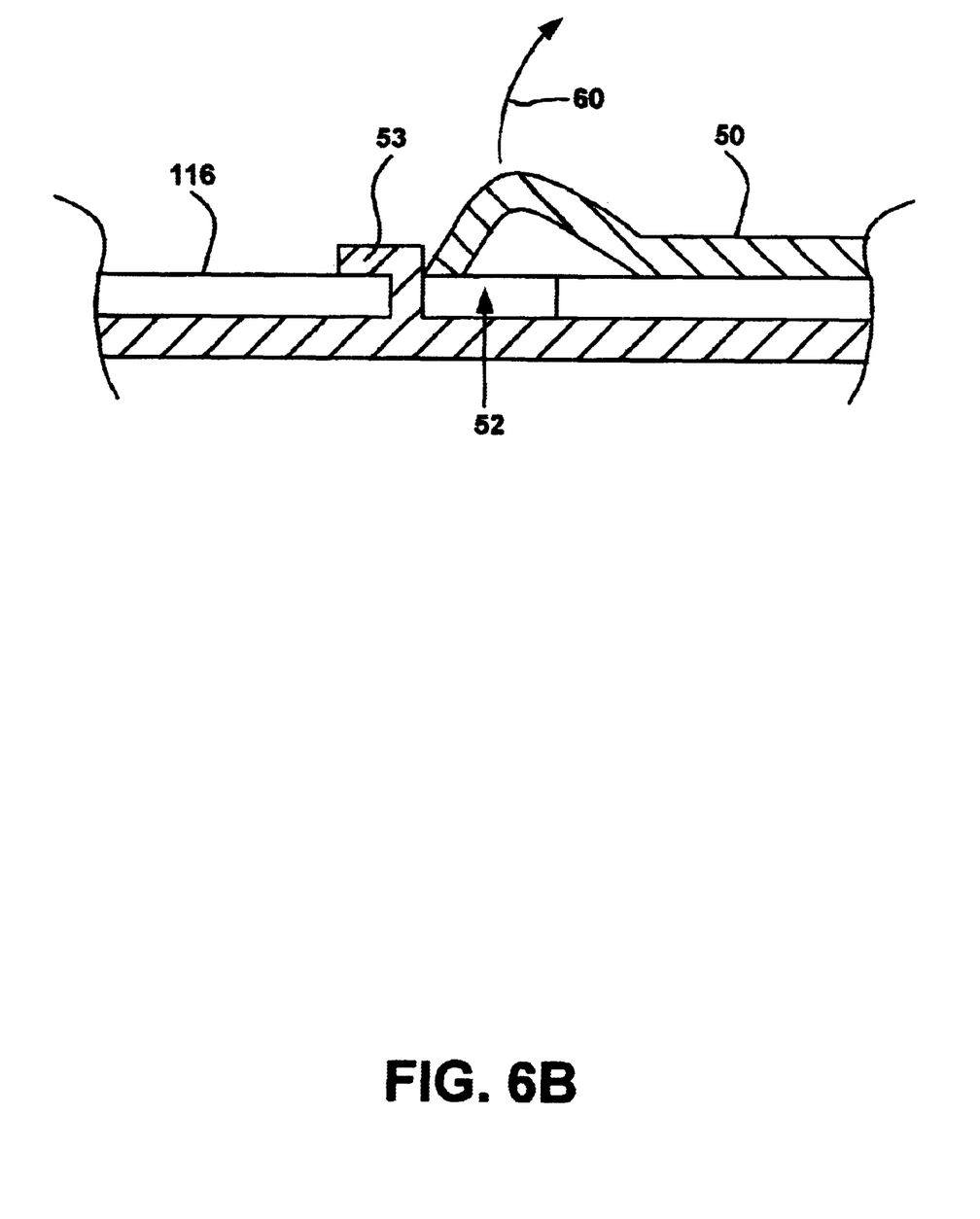
FIG. 6B shows an expanded cross sectional view of the structure of FIG. 5B across section B—B in accordance with an embodiment of the present invention.

Protrusion 53 is shown to have a rectangular cross section that corresponds to the shape of opening 52. Referring now to FIG. 5A and 6A, as protrusion 53 is inserted into opening 52, spring 50 deforms allowing protrusion 53 to be moved into that portion of opening 52 that is not covered by spring 50. When protrusion 53 is fully inserted in that portion of opening 52 that is not covered by spring 50, spring 50 automatically returns to its undeformed position as is illustrated in FIGS. 5B and 6B. Thereby the end surface 51 of spring 50 engages protrusion 53 so as to hold protrusion 53 securely in place.

Continuing with FIGS. 6A–6B chassis 120 can be easily detached from inner slide 50. Referring now to FIG. 6B, to detach chassis 120 from inner slide 50 spring 50 is moved in the direction indicated by arrow 60 so as to deform the spring in the direction indicated by arrow 60. In the present embodiment spring 50 includes a bend that allows for spring 50 to be easily grasped for movement of spring 50. The protrusion 53 is then removed from opening 52 while spring 50 is deformed. While spring 50 is deformed, the end surface of spring 50 no longer engages protrusion 53, freeing protrusion 53 such that protrusion 53 can be moved out of opening 52. Thereby chassis 120 can be easily detached from inner slide 50.

Accordingly, the detachment of slide 116 from chassis 120 does not require any tools. In addition, no tools are required to detach the inner slide from the chassis. Moreover, the attachment is simple and easy. Also the components are inexpensively fabricated.

Thus, the method and apparatus of the present invention allows for easily and inexpensively coupling a chassis to a slide. Also, the method and apparatus of the present invention does not require the use of tools to couple the chassis to the slide. In addition, tools are not required for uncoupling the chassis from the slide.

The embodiments illustrated in FIGS. 1A–6b are described as having the opening disposed in the inner slide and the protrusion extending from the chassis. However, alternatively the opening could extend through the chassis and the spring could be coupled to the chassis such that it partially extends over the opening. In this embodiment the protrusion could extend from the slide and would engage the opening for coupling the inner slide to the chassis.

In the embodiments illustrated in FIGS. 1A–6B a slide is illustrated as being coupled to the chassis. However, alternatively the methods and apparatus disclosed in FIGS. 1A–6B could be used to couple a slide (e.g., the outer slide) to the rack or could be used in other applications.

In one embodiment the chassis is formed of sheet metal and the protrusion is formed by a "Z-bend." Alternatively, the protrusion is formed by a separate part that is riveted to the chassis. In an alternate embodiment in which injection molding or casting techniques are used for forming the protrusion, the side of the chassis has a shape developed with the benefits of injection molding or casting techniques. In one embodiment this shape has a cross-section that is rounded or oval on one or more side. However, alternatively, a cross-section could be used that is angular on one or more side. It is appreciated that any of a number of other shapes could also be used.

Figure 7A:
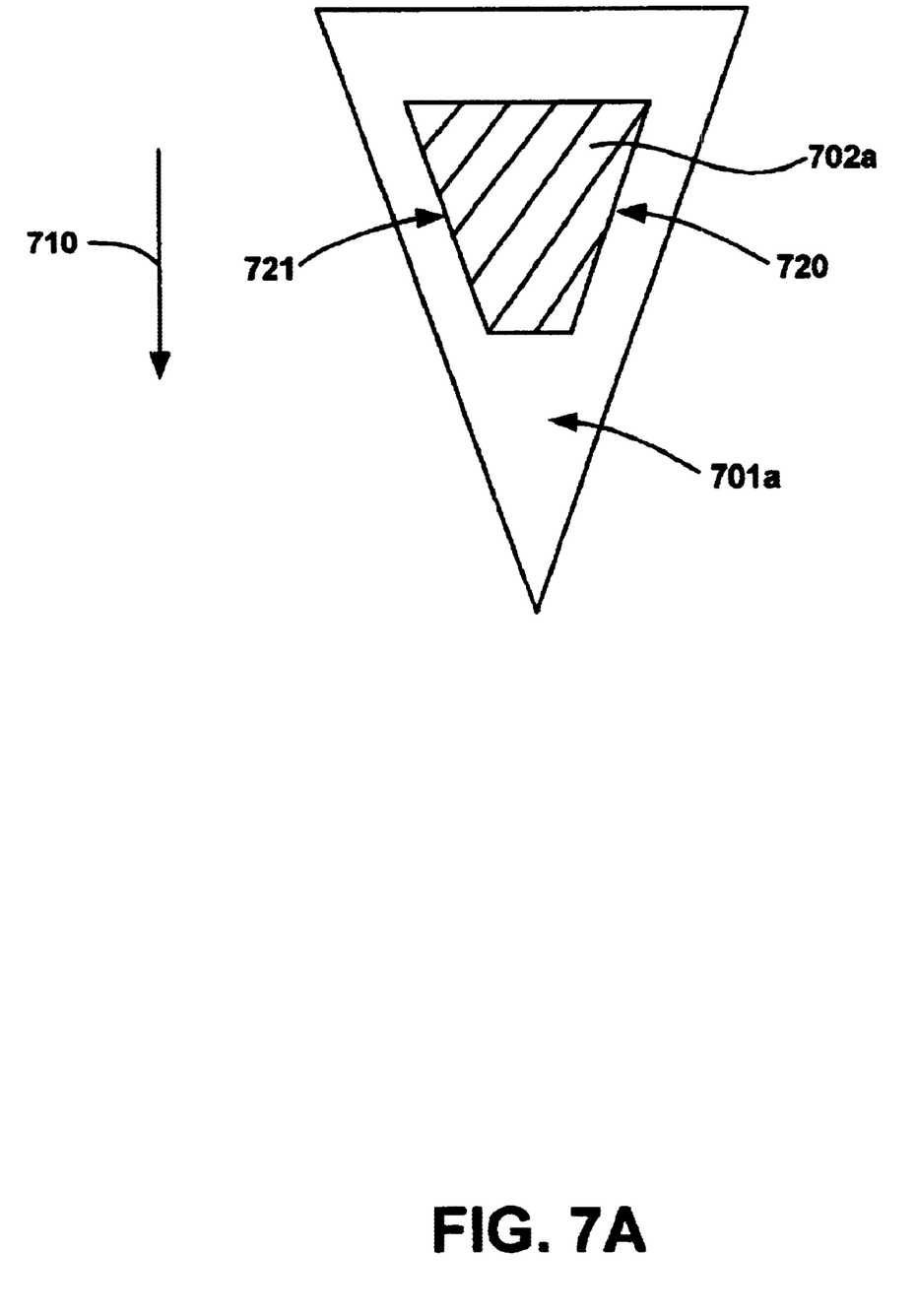
FIG. 7A shows an expanded cross sectional view of an embodiment in which the shape of the uncovered portion of the opening and the protrusion provides for self location and self alignment in accordance with an embodiment of the present invention.

In an alternate embodiment that is illustrated in FIG. 7A the uncovered portion of the opening 701a is triangular. In this embodiment, the cross-section of the protrusion across that portion of the protrusion that extends through the opening, shown as cross-section 702 is angled on two sides, shown as sides 720–721. The force of gravity as indicated by arrow 710 moves cross-section 702a down so that the protrusion is securely held within the uncovered portion of the opening 701a. Thereby the protrusion is self-aligned and self located with respect to the opening. One advantage to this embodiment is that there is no space or "tolerance" between the protrusion and the opening, giving a tight fit and no movement between the chassis and the slide once they are latched together. Though the sides of cross-section 702a is shown to be angular, alternatively the sides of cross-section 702a are sloped or rounded.

Figure 7B:
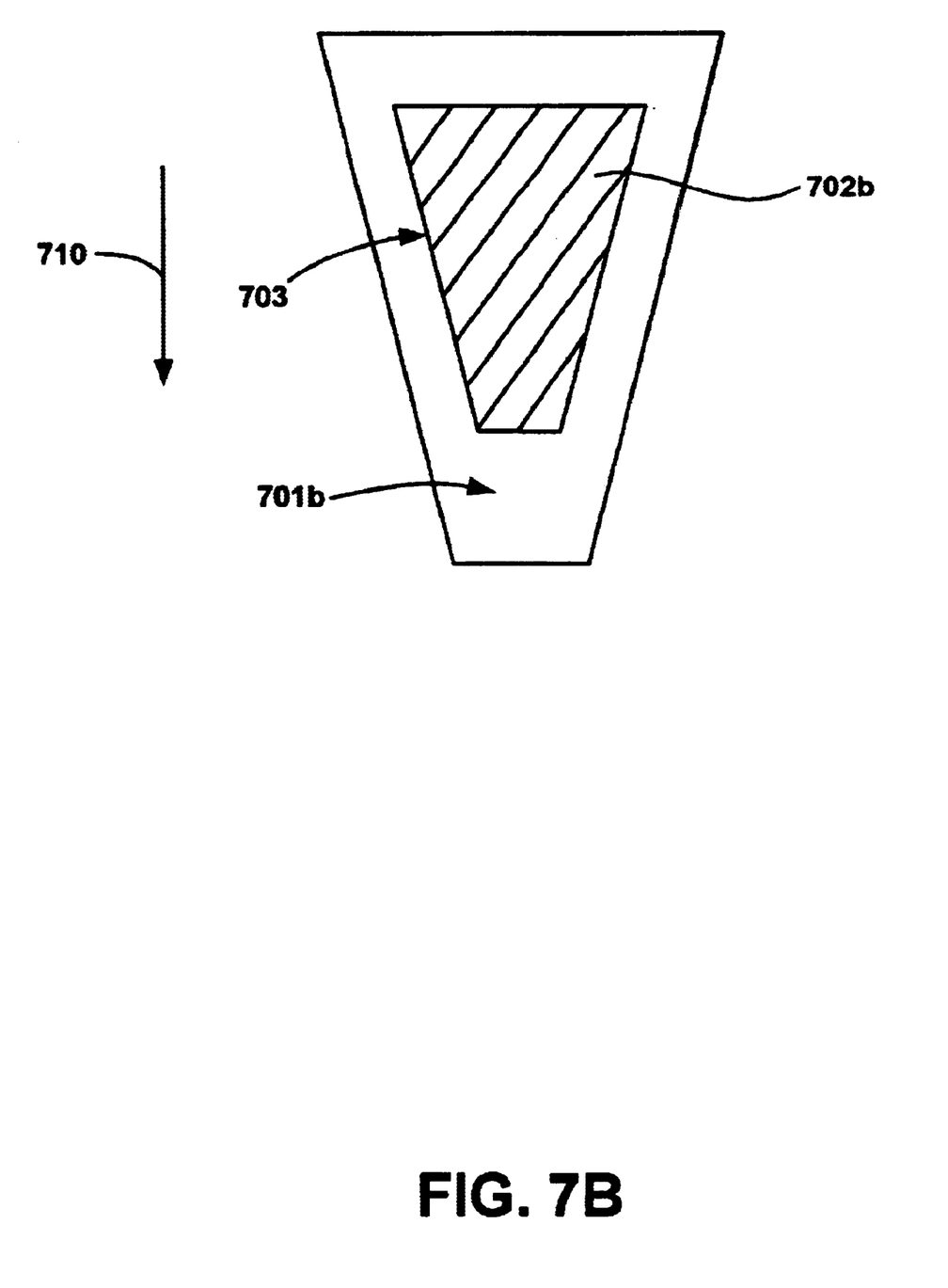
FIG. 7B shows an expanded cross sectional view of an embodiment in which the shape of the uncovered portion of the opening and the protrusion provides for self location and self alignment in accordance with an embodiment of the present invention.

In yet another embodiment that is illustrated in FIG. 7B, the uncovered portion of the opening 701b is only angled on one side to correspond with a protrusion having a cross-section 702b that is angled on only one side, shown as side 703. Though side 703 of cross-section 702b is shown to be angular, alternatively side 703 of cross-section 702 is sloped or rounded.

While the present invention has been described in particular embodiments, it should be appreciated that the present invention should not be construed as limited by such embodiments, but rather construed according to the below claims.

What is claimed is:

1. An assembly comprising:
   a first member having an opening extending therethrough;
   a spring coupled to said first member such that said spring extends over said opening so as to define an uncovered portion of said opening, said uncovered portion of said opening having a shape; and
   a second member including a protrusion that extends from said second member, said protrusion engaging said first opening so as to couple said first member to said second member, said spring engaging said protrusion so as to latch said first member to said second member, said protrusion having a cross section across that portion of said protrusion that extends through said opening that corresponds to said shape of said uncovered portion of said opening wherein said first member is a longitudinal member and wherein said second member is a chassis, said protrusion extending from a side surface of said chassis.

2. The assembly of claim 1 wherein said shape of said cross section is identical to said shape of said uncovered portion of said opening.

3. The assembly of claim 1 wherein said shape of said cross section is rectangular and wherein said shape of said uncovered portion of said opening is rectangular.

4. The assembly of claim 1 wherein said shape of said cross section is rounded and wherein said shape of said uncovered portion of said opening is rounded.

5. The assembly of claim 1 wherein said shape of said cross section is oval and wherein said shape of said uncovered portion of said opening and said shape of said cross section correspond such that said first member and said second member are self-aligned.

6. The assembly of claim 1 wherein said first member is a chassis and wherein said second member is a longitudinal member.

7. The assembly of claim 1 wherein said spring deforms when said protrusion is being inserted into said opening so as to allow said protrusion to enter said uncovered portion of said opening, said spring moving back into its undeformed shape when said protrusion is in said uncovered portion of said opening so as to latch said longitudinal member to a chassis such that no tools are required for coupling said chassis to said longitudinal member.

8. The assembly of claim 7 wherein said spring includes an end surface, said end surface engaging said protrusion when said protrusion is disposed in said uncovered portion of said opening so as to latch said longitudinal member to said chassis, said spring capable of being deformed for removing said protrusion from said opening to uncouple said longitudinal member from said chassis such that no tools are required for uncoupling said chassis from said longitudinal member.

9. A rack assembly comprising:
   a rack;
   a longitudinal member coupled to said rack and having an opening extending therethrough;
   a spring coupled to said longitudinal member such that said spring partially extends over said opening so as to define an uncovered portion of said opening, said uncovered portion of said opening having a shape; and
   a chassis for receiving a computer-related component, said chassis including a protrusion that extends from said chassis, said protrusion engaging said first opening so as to couple said chassis to said longitudinal member, said spring engaging said protrusion so as to latch said chassis to said longitudinal member.

10. The rack assembly of claim 9 wherein said protrusion has a cross section across that portion of said protrusion that extends through said opening that has a shape that corresponds to the shape of said uncovered portion of said opening.

11. The rack assembly of claim 10 wherein said cross section of said protrusion across that portion of said protrusion that extends through said opening is identical to said shape of said uncovered portion of said opening.

12. The rack assembly of claim 9 wherein said protrusion has a cross section across that portion of said protrusion that extends through said opening that has a rectangular shape and wherein said uncovered portion of said opening has a rectangular shape.

13. The rack assembly of claim 9 wherein said protrusion has a cross section across that portion of said protrusion that extends through said opening that has a rounded shape and wherein said uncovered portion of said opening has a rounded shape.

14. The rack assembly of claim 9 wherein said protrusion has a cross section across that portion of said protrusion that extends through said opening that has an oval shape and wherein said uncovered portion of said opening has an oval shape.

15. The rack assembly of claim 9 wherein said protrusion extends from a side surface of said chassis, said protrusion including a first portion that extends substantially perpendicular to said side surface of said chassis and including a second portion that extends substantially parallel to said side surface of said chassis, and wherein said spring deforms when said protrusion is being inserted into said opening so as to allow said protrusion to enter said uncovered portion of said opening, said spring moving back into its undeformed shape when said protrusion is in said uncovered portion of said opening so as to latch said longitudinal member to said chassis such that no tools are required for coupling said chassis to said longitudinal member.

16. The rack assembly of claim 15 wherein said spring includes an end surface, said end surface engaging said protrusion when said protrusion is disposed in said uncovered portion of said opening so as to latch said longitudinal member to said chassis, said spring capable of being deformed for removing said protrusion from said opening to uncouple said longitudinal member from said chassis such that no tools are required to uncouple said longitudinal member from said chassis.

17. A method for coupling a longitudinal member to a chassis comprising:
   providing a longitudinal member having an opening extending therethrough and having a spring coupled thereto that partially extends over said opening so as to define an uncovered portion of said opening, said uncovered portion of said opening having a shape;
   providing a chassis that includes a protrusion that extends from said chassis; and
   inserting said protrusion into said first opening, said spring deforming so as to allow said protrusion to enter said uncovered portion of said opening, said spring automatically moving back into its undeformed shape when said protrusion enters said uncovered portion of said opening so as to latch said longitudinal member to said chassis.

18. The method of claim 17 further comprising:
   deforming said spring such that said spring no longer engages said protrusion; and
   removing said protrusion from said opening while said spring is deformed to uncouple said longitudinal member from said chassis.

19. The method of claim 18 wherein no tools are required for coupling said chassis to said longitudinal member and wherein no tools are required for uncoupling said longitudinal member from said chassis.

* * * * *